United States Patent

Iino et al.

[11] Patent Number: 5,964,941
[45] Date of Patent: Oct. 12, 1999

[54] CRYSTAL PULLING METHOD AND APPARATUS

[75] Inventors: Eiichi Iino; Makoto Iida; Masanori Kimura, all of Annaka; Shozo Muraoka, Maebashi, all of Japan

[73] Assignee: Shin-Etsu Handotai., Ltd., Tokyo, Japan

[21] Appl. No.: 08/929,670

[22] Filed: Sep. 15, 1997

[30] Foreign Application Priority Data

Sep. 26, 1996 [JP] Japan .................................. 8-275417

[51] Int. Cl.⁶ ...................................................... C30B 15/30
[52] U.S. Cl. .............................. 117/13; 117/14; 117/208; 117/911; 117/932
[58] Field of Search .............................. 117/13, 208, 911, 117/932, 14

[56] References Cited

U.S. PATENT DOCUMENTS 5,126,113  6/1992  Yamagishi .............................. 117/208

FOREIGN PATENT DOCUMENTS

| 97-002893 | of 0000 | Japan . |
| A-62-288191 | 12/1987 | Japan . |
| 3-295893 | 12/1991 | Japan . |
| A-7-172981 | 7/1995 | Japan . |
| A-8-212055 | 8/1996 | Japan . |

*Primary Examiner*—Robert Kunemund
*Attorney, Agent, or Firm*—Oliff & Berridge PLC

[57] ABSTRACT

A method and an apparatus for pulling a single crystal are disclosed. A neck portion, a corrugated portion, and a single crystal are formed below a seed crystal held by a seed chuck. When the corrugated portion is raised to a predetermined position (where lifting jig can hold the corrugated portion) by the seed chuck, the rising speed Va of the seed chuck is reduced, and a slider that supports a seed chuck lifting mechanism is raised at a speed Vb in order to maintain a constant pulling speed of the single crystal. Eventually, the pulling by the seed chuck is switched to the pulling by the slider. Subsequently, the lifting jig provided on the slider is raised slightly by a moving mechanism so that the crystal holding portions of the lifting jig are brought into contact with the corrugated portion and 1–50% of the weight of the crystal is shifted to the lifting jig. This enables safe and accurate growth of a heavy single crystal in accordance with, for example, the CZ method.

9 Claims, 6 Drawing Sheets

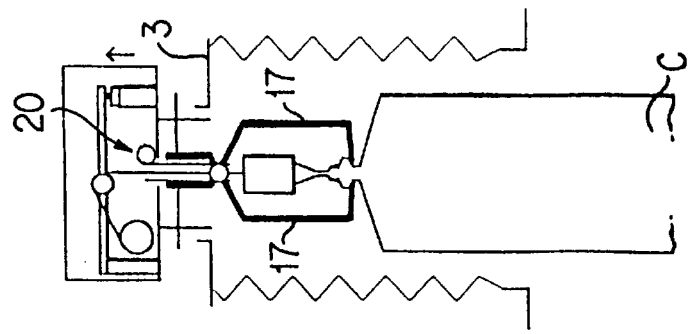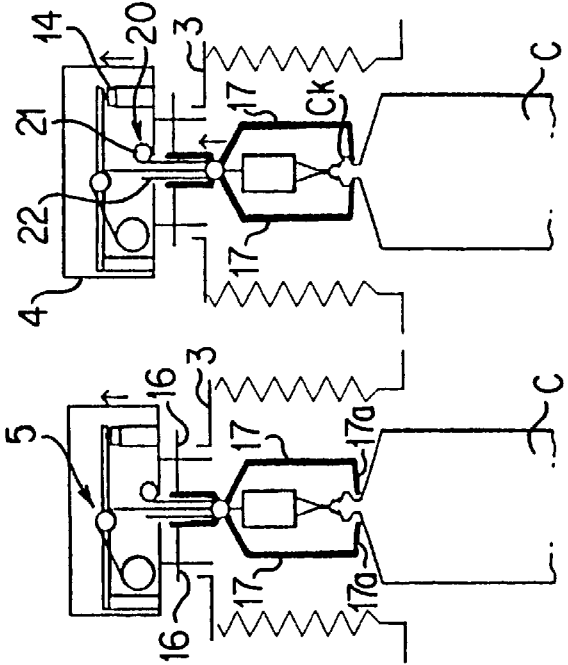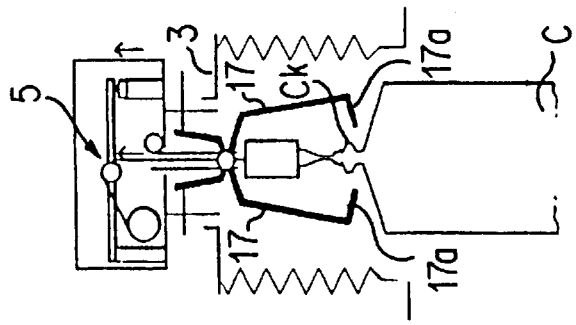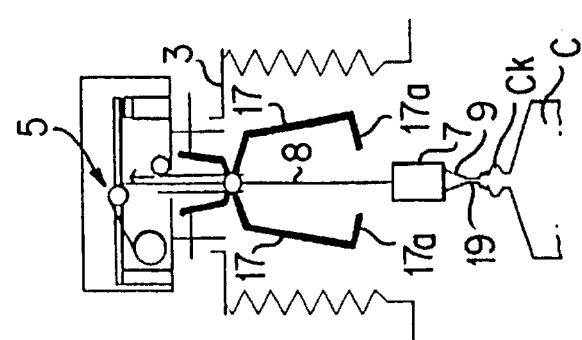

CRYSTAL PULLING METHOD AND APPARATUS

BACKGROUND OF THE INVENTION

1. Field of the Invention

The present invention relates to a crystal pulling method and apparatus employing, for example, the Czochralski method (the CZ method), and particularly to an improvement on a technique for mechanically holding a heavy single-crystal in order to pull the crystal safely and reliably, which improvement reduces variations in the diameter of a growing crystal at a point of time when the crystal is held, thereby enabling accurate growth of the crystal.

2. Description of the Related Art

Regarding a method of pulling a single crystal from a melt of a semiconductor material, such as silicon, contained in a crucible, the present applicant have proposed an improved pulling technique as described in, for example, Japanese Patent Application No. 8-212055.

Conventionally, a single crystal is pulled in a manner as shown in FIG. 5: a seed crystal 53 held by a seed chuck 52 at the lower end of a wire 51 is brought into contact with material melt contained in an unillustrated crucible, and the seed crystal 53 is pulled by a seed chuck lifting mechanism 54 in order to grow a single crystal C below the seed crystal 53. In order to improve this conventional manufacturing method, the technique disclosed in Japanese Patent Application No. 8-212055 employs an apparatus having the following structure: a retaining case 57 is mounted on a slider 56 which is vertically moved by an unillustrated slider moving mechanism; the seed chuck lifting mechanism 54 for winding the wire 51 is provided within the retaining case 57; and a lifting jig 60 composed of paired members is provided below the retaining case 57. The lower ends of the paired members of the lifting jig 60 are opened and closed through operation of cylinder units 58. At the beginning of pulling, the single crystal C is pulled by the seed chuck 52, and pulling by the seed chuck 52 is switched to pulling by the lifting jig 60 when the crystal C has grown to become heavy.

That is, initially, with the slider 56 fixed at a certain position, the seed crystal 53 held by the seed chuck 52 is brought into contact with the material melt, and subsequently the seed chuck 52 is pulled by the seed chuck lifting mechanism 54. As a result, as shown in FIG. 5A, a neck portion 59, a corrugated portion Ck, and the single crystal C are formed below the seed crystal 53.

When the corrugated portion Ck rises to a predetermined position shown in FIG. 5B, the lifting jig 60 is operated as shown in FIG. 5C such that the lower end portions of the paired members of the lifting jig 60 approach the smaller-diameter portion of the corrugated portion Ck with a clearance remaining between the lower end portions of the paired members of the lifting jig 60 and the smaller-diameter portion of the corrugated portion Ck. Subsequently, as shown in FIG. 5D, the slider 56 is raised, while the seed chuck lifting mechanism 54 is operated in reverse in order to lower the single crystal C relative to the slider 56, such that the larger-diameter portion of the corrugated portion Ck comes into contact with and sits on the lifting jig 60.

At this time, control is performed such that the sum of the rising speed Vb of the slider 56 and the rising speed Va of the seed chuck 52 relative to the slider 56 becomes identical to the previous rising speed of the seed chuck 52 as measured when solely the seed chuck 52 was engaged in pulling. Also, when a predetermined portion of the entire load of the single crystal C has shifted to the lifting jig 60, the seed chuck lifting mechanism 54 is stopped, as shown in FIG. 5E, so that the pulling operation is performed by only the lifting jig 60; i.e., only the slider 56 is raised.

Since the lifting jig 60 contacts the corrugated portion Ck of the crystal not in a lateral direction but in the vertical direction, the crystal can be pulled safely and reliably without generation of dislocation in the crystal.

In this technique, when the pulling by the seed chuck 52 is switched to the pulling by the lifting jig 60, as shown in FIG. 6, the rising speed Va of the seed chuck 52 is decreased, and eventually the seed chuck 52 is lowered relative to the slider 56 (lifting jig 60) (Va becomes negative) in order to shift the weight of the single crystal C to the lifting jig 60.

In the above-described technique, the weight of the single crystal C acting on the seed chuck 52 is shifted to the lifting jig 60 while the speed Vb of the lifting jig 60 and the speed Va of the seed chuck 52 are changed in order to switch the pulling means. Therefore, when the lifting jig 60 deforms due to the weight of the crystal or slip occurs between the lifting jig 60 and the corrugated portion Ck, the speeds Va and Vb must be controlled in consideration of an increased number of factors including the above-described deformation and slip, so that the speed control becomes complex and fine adjustment becomes difficult to perform.

If fine adjustment of the speeds Va and Vb cannot be performed correctly, the growth rate of the single crystal varies, so that variations in the diameter of the crystal and other problems occur.

Therefore, there has been strong demand for a technique that can accurately control the diameter of a single crystal being pulled through simplified growth rate control, without use of the above-described complicated control.

SUMMARY OF THE INVENTION

An object of the present invention is to provide a method and an apparatus for pulling a single crystal which enable safe and accurate growth of a heavy single crystal in accordance with, for example, the CZ method.

In order to achieve the above object, the present invention provides a crystal pulling method comprising the steps of: bringing a seed crystal held by a seed chuck into contact with material melt in a crucible; raising the seed chuck in order to grow a single crystal below the seed crystal; when the single crystal reaches a predetermined position, decreasing the pulling speed of the seed chuck and raising a slider that supports the seed chuck in order to maintain a constant pulling speed of the single crystal; and after the pulling by the seed chuck is switched completely to the pulling by the upward movement of the slider, moving a lifting jig provided on the slider or at least a part of the lifting jig in the vertical direction such that the lifting jig or the part thereof comes into contact with and holds a predetermined portion of the crystal.

That is, switching the pulling operation by the seed chuck to the pulling operation by the lifting jig and shifting the weight of the crystal to the lifting jig are performed independently at different points in time in order to reduce the number of controlled variables to be controlled simultaneously. As a result, it becomes possible to correct errors stemming from deformation of the lifting jig and slip between the lifting jig and a portion of the crystal to be held, which occurs when the weight of the crystal is shifted to the lifting jig. According, it is possible to grow a single crystal while reducing variations in the diameter of the single crystal.

In the conventional technique, in order to bring the crystal into contact with the lifting jig, the crystal is moved vertically relative to the lifting jig, which is maintained stationary relative to the slider. By contrast, in the present invention, the lifting jig or at least a part thereof is moved vertically in order to establish contact with the crystal. The expression "at least a part of the lifting jig" refers to a portion of the lifting jig which can come into contact with the crystal.

Preferably, the portion of the crystal with which the lifting jig comes into contact is a corrugated portion of the crystal which is formed intentionally or naturally.

For example, the lifting jig is caused to approach a smaller-diameter portion of the corrugated portion and to receive a larger-diameter portion of the corrugated portion adjacent to the smaller-diameter portion.

When the lifting jig is moved in order to establish contact with the predetermined portion of the crystal, 1 to 50% of the load acting on the seed chuck is preferably shifted to the lifting jig.

The reason why the lower limit can be set as low as 1% is that even when only a small portion of the load is shifted to the lifting jig at the beginning, more of the load is shifted to the lifting jig when the wire stretches slightly as the single crystal grows and the weight thereof increases. If a large portion of the load in excess of a predetermined value is shifted to the lifting jig at the beginning, the growth rate of the crystal increases temporarily, so that the diameter of the crystal varies. Therefore, in order to suppress the variation in the diameter, the ratio of the portion of the load shifted to the lifting jig at the beginning must be less than about 50%. In order to minimize the variation in the diameter, the ratio is preferably set to be equal to or less than about 25%

The present invention also provides a crystal pulling apparatus in which a seed crystal held by a seed chuck is brought into contact with material melt in a crucible, the seed chuck is raised in order to grow a single crystal below the seed crystal, and a lifting jig is caused to come into contact with a portion of the single crystal in the course of the pulling operation in order to switch the pulling by the seed chuck to the pulling by the lifting jig. The apparatus is characterized in that the seed chuck and the lifting jig are disposed on a slider that is moved vertically through use of an elevating mechanism such that the seed chuck and the lifting jig can move vertically independently of each other, and the entire lifting jig or at least a part of the lifting jig is moved vertically relative to the slider through use of a moving mechanism.

The crystal pulling apparatus having the above-described structure can be used to pull a single crystal in according to the above-described crystal pulling method.

BRIEF DESCRIPTION OF THE DRAWINGS

FIGS. 2A–2E are views showing a crystal pulling method according to the present invention;

DESCRIPTION OF THE PREFERRED EMBODIMENT

An embodiment of the present invention will now be described in detail with reference to the drawings.

Figure 1:
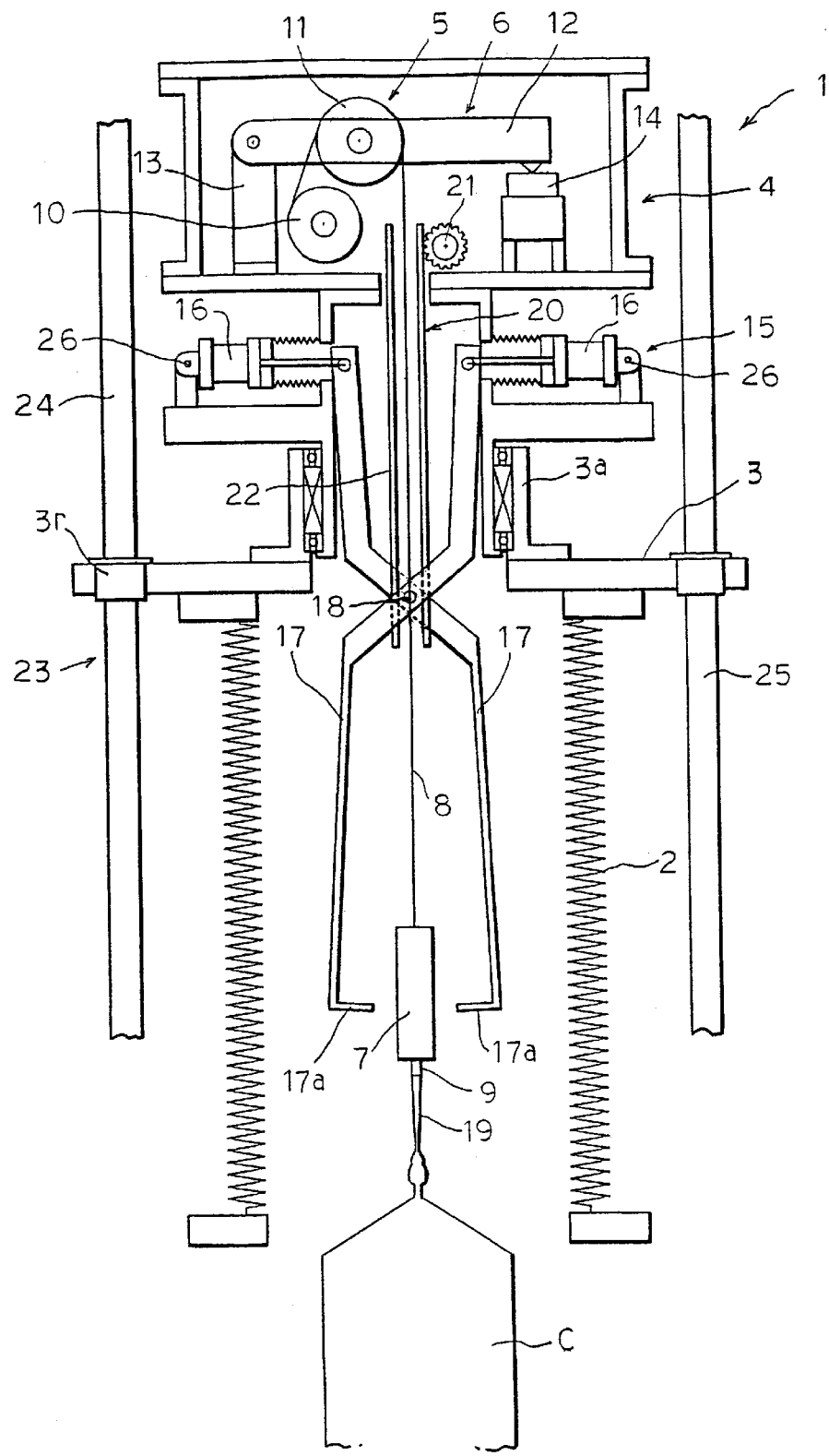
FIG. 1 is a schematic view showing the structure of a crystal pulling apparatus according to the present invention.

The crystal pulling apparatus of the present invention employs the Czochralski method (CZ method) for growing a crystal of, for example, a semiconductor material such as silicon, and is suited for the safe and accurate manufacture of heavy single crystals. First, the basic structure of the crystal pulling apparatus will be described with reference to FIG. 1.

The crystal pulling apparatus 1 comprises an unillustrated lower chamber which contains an unillustrated crucible, an expandable bellows chamber 2 attached to the upper portion of the lower chamber, and a slider 3 attached to the upper portion of the bellows chamber 2. On the slider 3, a retaining case 4 is rotatably supported by a cylindrical bearing 3a.

The slider 3 is moved vertically by an elevating mechanism 23. The elevating mechanism 23 comprises a ball screw 24 that is rotated about a vertical axis by an unillustrated drive source, a screw-engagement portion 3r of the slider 3 which is in screw-engagement with the ball screw 24, and a guide bar 25 for guiding vertical movement of the slider 3. As the ball screw 24 is rotated, the slider 3 moves vertically, while the bellows chamber 2 expands and contracts.

In the upper portion of the retaining case 4 are disposed a seed chuck lifting mechanism 5 and a load measurement mechanism 6. The seed chuck lifting mechanism 5 includes a guide pulley 11 and a winding drum 10 for winding a wire 8, to the tip end of which is attached the seed chuck 7. A seed crystal 9 is held at the tip end of the seed chuck 7.

The load measurement mechanism 6 comprises an arm 12 for supporting the guide pulley 11, a support member 13 on which the base end of the arm 12 is pivotably supported, and a load cell 14 on which the tip end of the arm 12 rests. When the single crystal C being grown is pulled by the seed chuck lifting mechanism 5, the load which acts on the load cell 14 via the guide pulley 11 and the arm 12 is measured in order to determine the weight of the single crystal C.

In the middle portion of the retaining case 4 is provided a lifting jig drive mechanism 15. This lifting jig drive mechanism 15 includes a pair of open/close cylinder units 16, and a pair of members which constitute a lifting jig 17 and are connected to the tip ends of the piston rods of the cylinder units 16. The lifting jig 17 has a scissors-like shape in which the intermediate portions of the paired members of the lifting jig 17 are coupled together via a pin 18 for pivotal movement. Therefore, when the cylinder units 16 are operated, crystal holding portions 17a provided at the lower end of the paired members of the lifting jig 17 are opened and closed.

The lifting jig 17 is moved in the vertical direction by a moving mechanism 20 over a predetermined stroke. The moving mechanism 20 includes a pinion 21 which is rotated by an unillustrated drive source, and a rack pipe 22 which is meshed with the pinion 21 to be moved in the vertical direction. The pin 18 of the lifting jig 17 is supported by the rack pipe 22.

The base ends of the cylinder units 16 are pivotably attached to the retaining case 4 via pins 26, so that the front ends of the cylinder units 16 (where the paired members of the lifting jig 17 are connected to the cylinder units 16) are swingable in the vertical direction.

Accordingly, when the pinion 21 rotates, the rack pipe 22 moves vertically, and the lifting jig 17 therefore moves vertically.

A method of pulling a single crystal through use of a crystal pulling apparatus having the above-described structure will now be described with reference to FIG. 2.

First, the seed crystal 9 held by the seed chuck 7 is brought into contact with the surface of material melt contained in the crucible. Then, the wire 8 is pulled at a predetermined speed by the seed chuck lifting mechanism 5. A neck portion 19, a corrugated portion Ck, and a single crystal C are formed below the seed crystal 9. At this time, the corrugated portion Ck may be formed naturally or intentionally through control of the pulling speed of the seed crystal 9 or the temperature of the melt in the crucible or both. Also, the shape and position of the corrugated portion Ck are not limited to those described above, and the corrugated portion Ck may have any shape and may be formed at any position, provided that the lifting jig 17 can hold the corrugated portion.

At this time, as shown in FIG. 2A, the slider 3 is positioned at a predetermined position, and the crystal holding portions 17a of the lifting jig 17 are opened.

Subsequently, as shown in FIG. 2B, when the corrugated portion Ck of the single crystal C is pulled to a position such that the crystal holding portions 17a of the lifting jig 17 can hold the corrugated portion Ck, the slider 3 is raised, and the speed of the seed chuck lifting mechanism 5 pulling the seed chuck 7 is decreased.

At this time, when it is assumed that the rising speed of the slider 3 (lifting jig 17) is Vb, and the rising speed of the seed chuck 7 relative to the slider 3 is Va, these speeds Va and Vb are controlled such that their sum Va+Vb becomes constant from a point (point x) in time when the upward movement of the slider 3 (lifting jig 17) starts. Therefore, the speed of the slider 3 (lifting jig 17) is increased by an amount corresponding to the amount of speed reduction of the seed chuck 7.

Figure 3:
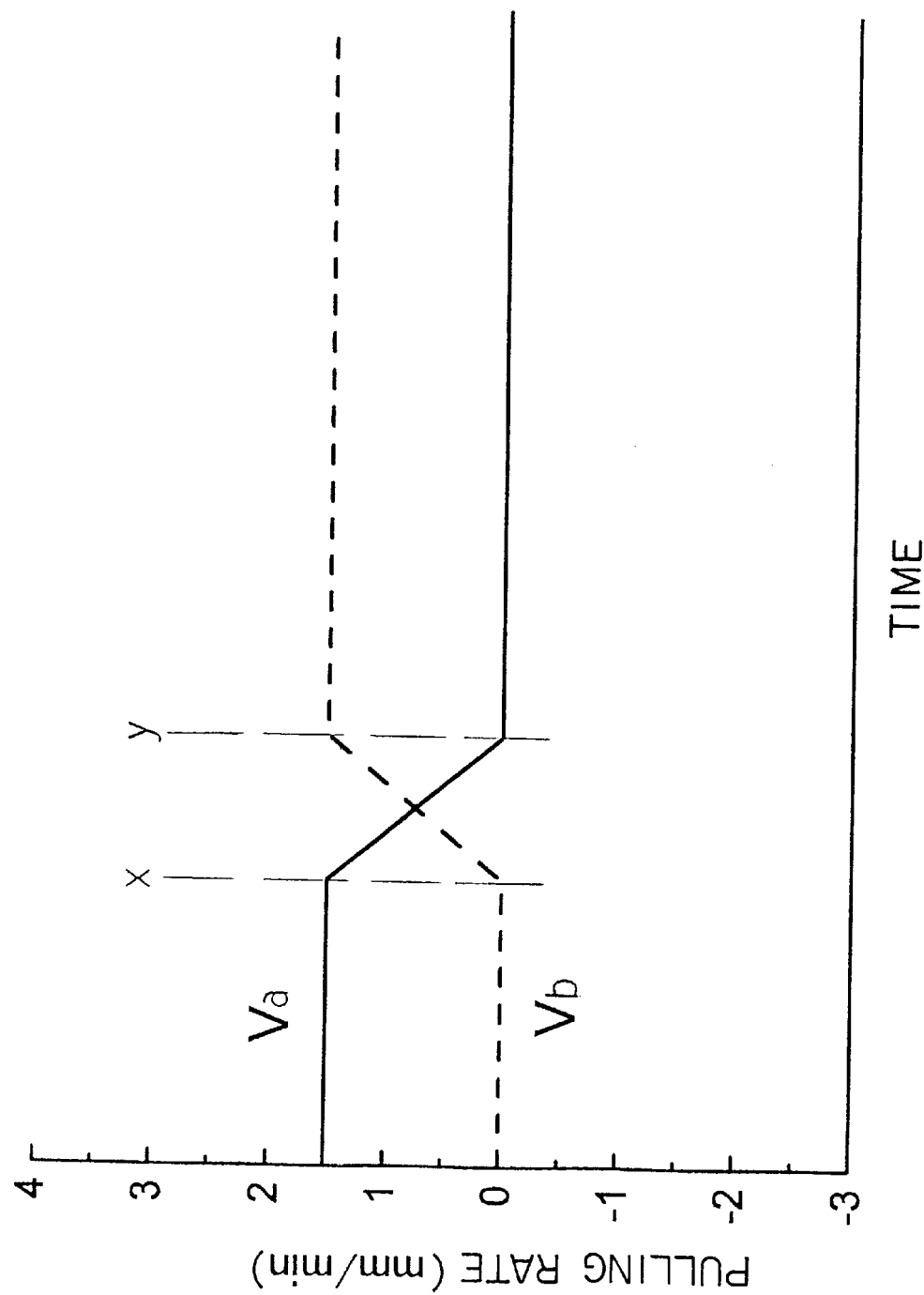
FIG. 3 is a graph showing variations in the speeds of the seed chuck and the lifting jig when pulling means is switched in the crystal pulling method of the present invention, wherein Vb is the speed of the lifting jig, and Va is the speed of the seed chuck relative to the lifting jig.

At point y in FIG. 3, the rising speed Va of the seed chuck 7 becomes zero, and the rising speed Vb of the lifting jig 17 (slider 3) reaches a speed corresponding to the predetermined pulling speed. After this point in time, the pulling operation is performed by only the lifting jig 17.

After the pulling means is switched in the above-described manner, as shown in FIG. 2C, the open/close cylinder units 16 are operated in order to close the crystal holding portions 17a of the lifting jig 17. At this time, the crystal holding portions 17a may be brought into contact with the corrugated portion Ck. However, in the present embodiment, the crystal holding portions 17a are caused to approach a smaller-diameter portion of the corrugated portion Ck with a clearance being left therebetween. This prevents generation of vibrations and/or dislocation stemming from a lateral force acting on the single crystal, which would occur if the crystal holding portions 17a were brought into contact with the smaller-diameter portion of the corrugated portion Ck at this point in the pulling operation.

After the lifting jig 17 is closed, as shown in FIG. 2D, the pinion 21 of the moving mechanism 20 is rotated such that the lifting jig 17 is lifted slightly by the rack pipe 22.

Consequently, the upper portions of the crystal holding portions 17a come into contact with the larger-diameter portion of the corrugated portion Ck, so that the load or weight of the single crystal that has acted solely on the seed chuck 7 starts to shift to the lifting jig 17, and the load detected by the load cell 14 decreases.

When a predetermined portion of the load has been shifted to the lifting jig 17, the lifting movement of the lifting jig 17 by the moving mechanism 20 is stopped.

The ratio of the portion of the load shifted to the lifting jig 17 is set to be within the range of 1% to 50% with respect to the initial load detected by the load cell 14, preferably equal to or less than 25%. If the ratio is set to an excessively large value, the growth rate of the crystal temporarily become too high, resulting in variations in the diameter of the crystal.

When the load shift is completed, the pulling operation by the lifting jig 17 is continued (FIG. 2E).

EXAMPLES

The present invention will be described by way of example. However, the present invention is not limited thereto.

Example 1 and Comparative Example

A single crystal C having a diameter of 150 mm and a weight of 50 kg was grown by the pulling method of the present invention shown in FIGS. 2A–2E, and by the conventional pulling method shown in FIGS. 5A–5E. In either case, the pulling means was switched from the seed chuck to the lifting jig when the crystal C reached a position where the weight of the crystal C became about 30 kg. The ratio of the weight of the crystal shifted to the lifting jig at this time was set to 50%.

Comparison between the manufactured crystals C in terms of shape revealed that variation in crystal diameter was observed in both cases at the portion where the weight of the crystal was shifted to the lifting jig, and that the diameter variation was −2.0 mm in the crystal manufactured by the conventional method, whereas the diameter variation was −1.0 mm in the crystal manufactured by the method of the present invention, which was smaller than that of the crystal manufactured by the conventional method.

Example 2

A single crystal C having a diameter of 150 mm and a weight of 50 kg was grown by the pulling method of the present invention shown in FIGS. 2A–2E, and the pulling means was switched from the seed chuck 7 to the lifting jig 17 when the crystal C reached a position where the weight of the crystal C became about 30 kg. This pulling operation was repeated while the ratio of the load shifted to the lifting jig 17 was varied, and variations in diameter were measured. The test results are shown in Table 1.

TABLE 1

|  | 1 | 2 | 3 | 4 | 5 |
|---|---|---|---|---|---|
| Ratio of Load shift (%) | 0 | 1 | 25 | 50 | 60 |
| Variation in diameter (mm) | 0.0 | 0.0 | −0.3 | −1.0 | −2.1 |

From the test results, it was confirmed that variations in diameter increase as the ratio of load shift is increased and that when the ratio becomes greater than 50%, the variations in diameter become large to an extent that would cause problems in practice. Setting the ratio of load shift to 0% is not practical, because it becomes impossible to confirm whether the lifting jig comes into contact with the crystal.

Figure 4:
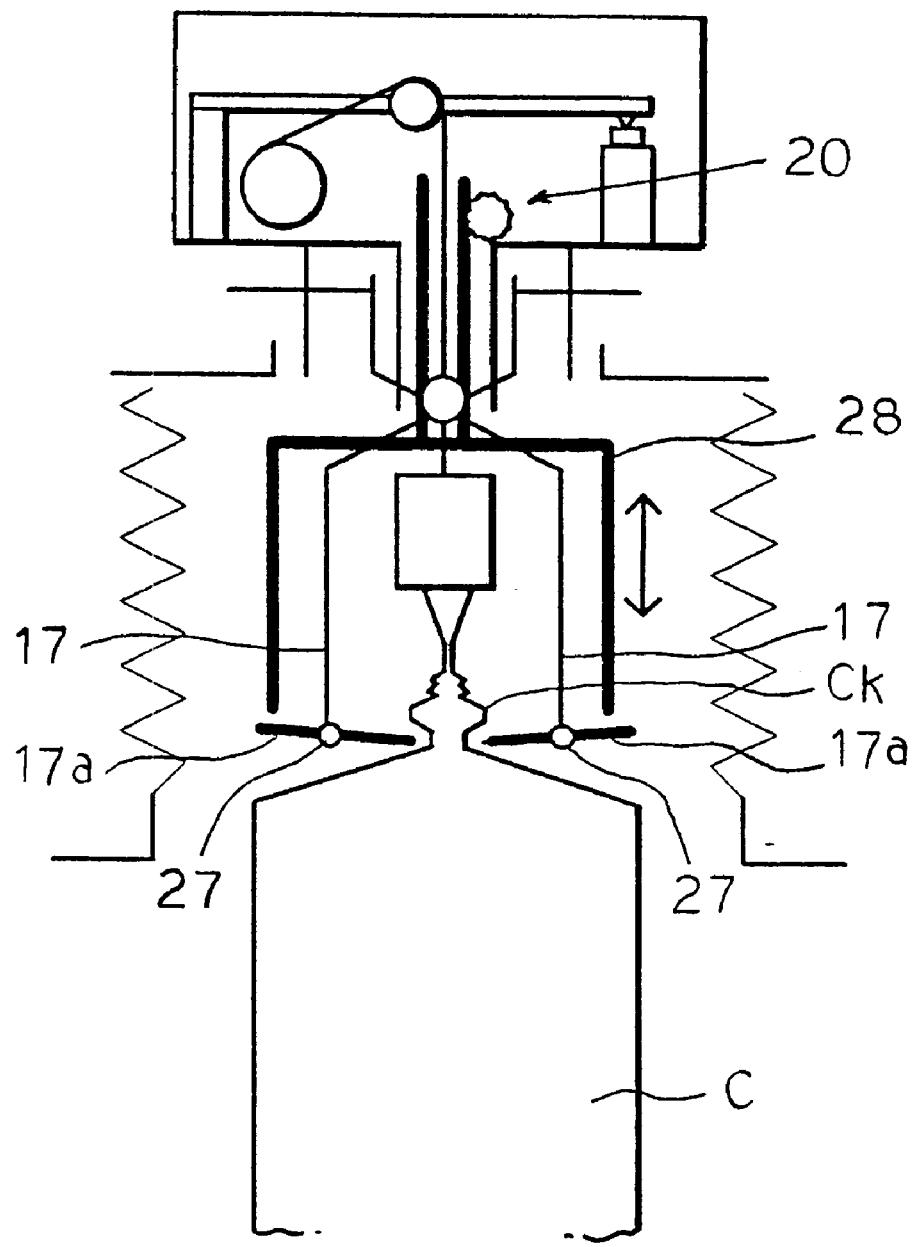
FIG. 4 is a view showing another exemplary structure of the lifting jig in which the tip end portions of paired members constituting the lifting jig are swingable.
Figure 5A:
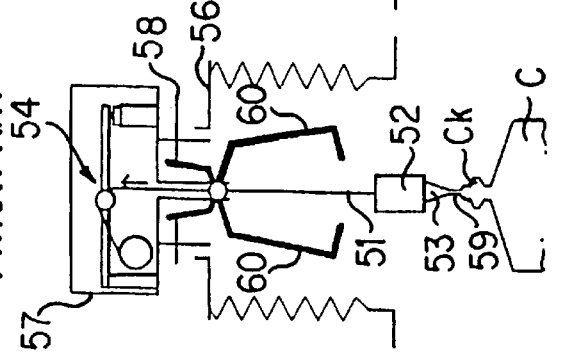
FIGS. 5A–5E are views showing a conventional crystal pulling method.
Figure 5B:
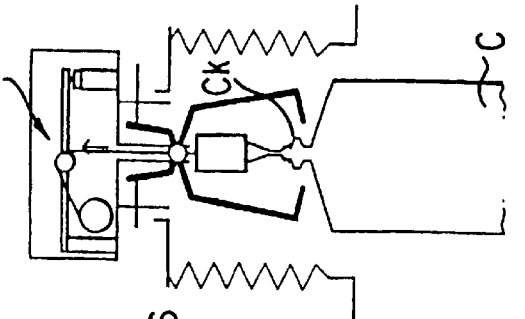
Figure 5C:
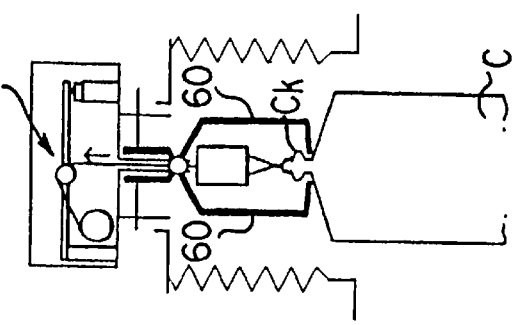
Figure 5D:
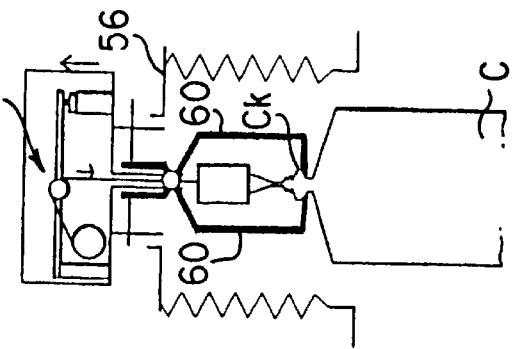
Figure 5E:
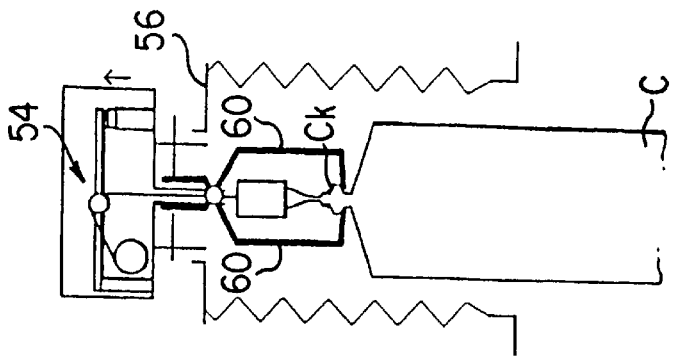
Figure 6:
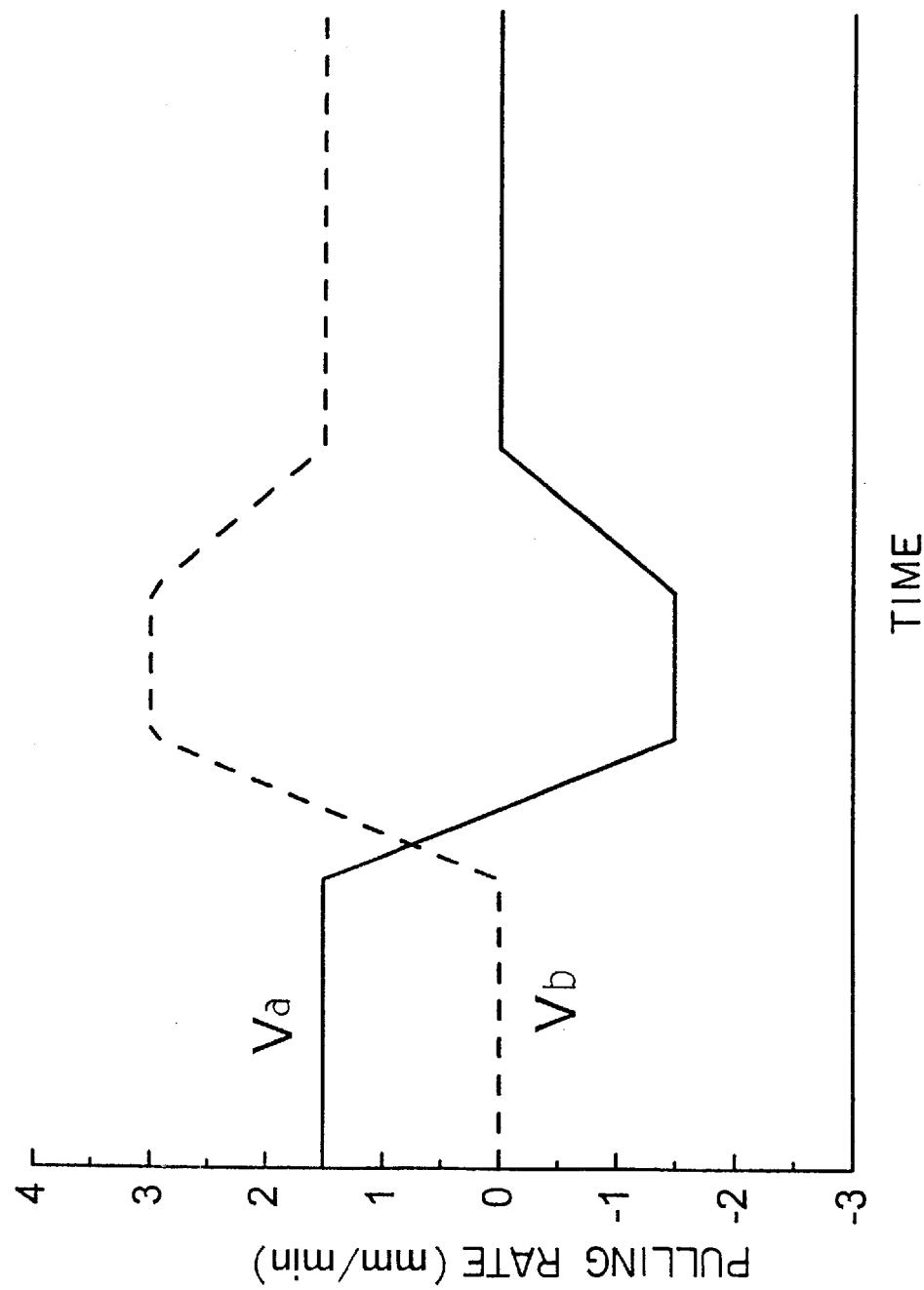
FIG. 6 is a graph showing variations in the speeds of the seed chuck and the lifting jig when pulling means is switched in the conventional pulling method, wherein Vb is the speed of the lifting jig, and Va is the speed of the seed chuck relative to the lifting jig.

The crystal holding portions 17a of the lifting jig 17 of the present invention may have a structure shown in FIG. 4, in which the crystal holding portions 17a are movable.

That is, in the structure shown in FIG. 4, the center portions of the crystal holding portions 17a are pivotably attached to the tip ends of the paired members of the lifting jig 17 via pins 27. The outer ends of the crystal holding portions 17a are pushed by a movable member 28, which is moved vertically through use of a rack-and-pinion mechanism, so that the crystal holding portions 17a swing in order to move the crystal holding ends thereof in the vertical direction.

In this case, since the length of the crystal holding portions 17a is short, an amount of deformation stemming from holding of a crystal by the lifting jig 17 is smaller than that in the case where the entire lifting jig 17 having a large length is opened and closed. Accordingly, the crystal holding ends can be positioned at a desired position with improved accuracy. In addition, since the crystal being grown is held accurately, slippage or other problems do not occur when the crystal is held by the lifting jig.

The present invention is not limited to the above-described embodiment. The above-described embodiment is a mere example, and those having the substantially same structure as that described in the appended claims and providing the similar action and effects are included in the scope of the present invention.

What is claimed is:

1. A crystal pulling method comprising the steps of:

bringing a seed crystal held by a seed chuck into contact with material melt in a crucible;

raising the seed chuck in order to grow a single crystal below the seed crystal;

when the single crystal reaches a predetermined position, decreasing the pulling speed of the seed chuck and raising a slider that supports the seed chuck in order to maintain a constant pulling speed of the single crystal; and after the pulling by the seed chuck is switched completely to the pulling by the upward movement of the slider, moving a lifting jig provided on the slider or at least a part of the lifting jig in the vertical direction such that the lifting jig or the part thereof comes into contact with and holds a portion of the crystal.

2. A crystal pulling method according to claim 1, wherein the portion of the crystal with which said lifting jig comes into contact is a corrugated portion of the crystal which is formed intentionally or naturally.

3. A crystal pulling method according to claim 1, wherein when said lifting jig is moved in order to establish contact with the portion of the crystal, 1 to 50% of the load acting on the seed chuck is shifted to said lifting jig.

4. A crystal pulling method according to claim 2, wherein when said lifting jig is moved in order to establish contact with the portion of the crystal, 1 to 50% of the load acting on the seed chuck is shifted to said lifting jig.

5. The crystal pulling method of claim 1, wherein moving a lifting jig includes moving the lifting jig relative to the slider.

6. The crystal pulling method of claim 5, wherein moving the lifting jig relative to the slider includes activating a moving mechanism to move a rack tube attached to the lifting jig by rotating a pinion engageable with the rack tube.

7. A crystal pulling apparatus in which a seed crystal held by a seed chuck is brought into contact with material melt in a crucible, the seed chuck is raised in order to grow a single crystal below the seed crystal, and a lifting jig is caused to come into contact with a portion of the single crystal in the course of the pulling operation in order to switch the pulling by the seed chuck to the pulling by the lifting jig, wherein said seed chuck and said lifting jig are disposed on a slider that is moved vertically through use of an elevating mechanism such that said seed chuck and said lifting jig can move vertically independently of each other, and said entire lifting jig or at least a part of the lifting jig is moved vertically relative to said slider through use of a moving mechanism.

8. The crystal pulling apparatus of claim 7, wherein the moving mechanism includes a pinion and a rack tube engageable with the pinion, the rack tube being connectable to the lifting jig such that when the pinion is engaged with the rack tube and rotated, the rack tube and the lifting jig are moved in the vertical direction.

9. The crystal pulling apparatus of claim 8, wherein the lifting jig contacts the crystal after the moving mechanism begins moving the lifting jig relative to the slider.

* * * * *